United States Patent
Sekiguchi

(10) Patent No.: US 6,272,045 B1
(45) Date of Patent: Aug. 7, 2001

(54) NONVOLATILE SEMICONDUCTOR MEMORY DEVICE

(75) Inventor: Mitsuru Sekiguchi, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/527,825

(22) Filed: Mar. 17, 2000

(30) Foreign Application Priority Data

Mar. 24, 1999 (JP) .................................. 11-079979

(51) Int. Cl.[7] .................................................. G11C 16/04
(52) U.S. Cl. .................. 365/185.17; 365/185.29
(58) Field of Search .................. 365/185.05, 185.17, 365/185.09, 185.23, 185.29

(56) References Cited

U.S. PATENT DOCUMENTS

| | | | |
|---|---|---|---|
| 5,198,998 | * 3/1993 | Kobatake | 365/185.23 |
| 5,978,273 | * 11/1999 | Shigemura | 365/185.29 |
| 6,141,250 | * 10/2000 | Kashimura | 365/185.11 |
| 6,144,584 | * 11/2000 | Kumori | 365/185.23 |

FOREIGN PATENT DOCUMENTS

| | | |
|---|---|---|
| 4-278297 | 10/1992 | (JP) . |
| 6-302190 | 10/1994 | (JP) . |
| 8-46159 | 2/1996 | (JP) . |
| 9-504898 | 5/1997 | (JP) . |

* cited by examiner

Primary Examiner—Trong Phan
(74) Attorney, Agent, or Firm—McGinn & Gibb, PLLC

(57) ABSTRACT

A nonvolatile semiconductor memory device has writing signal line selecting transistors for applying writing signals to memory elements, respectively, reading signal line selecting transistors for delivering reading signals from the memory elements, respectively, and bit line selecting transistors connected between the writing signal line selecting transistors or the reading signal line selecting transistors and the memory elements, for selecting bit lines of each of the memory elements.

20 Claims, 1 Drawing Sheet

NONVOLATILE SEMICONDUCTOR MEMORY DEVICE

BACKGROUND OF THE INVENTION

1. Field of the Invention

The present invention relates to a nonvolatile semiconductor memory device for reading stored data at an increased speed without causing a delay in the speed for writing data.

2. Description of the Related Art

As disclosed in Japanese laid-open patent publications Nos. 4-278297, 6-302190, and 8-46159, nonvolatile semiconductor memory devices are generally also called EEPROM (Electrically Erasable Programmable ROM). One known EEPROM that can be fabricated as a highly integrated circuit is a NAND-cell-type EEPROM comprising a plurality of series-connected memory transistors. Each of the memory transistors has a MOSFET structure including a floating gate and a control gate that are accumulated on a semiconductor substrate with an insulating film interposed therebetween. The memory transistors are connected in series such that adjacent ones of the memory transistors share a source and a drain. The NAND cells are arranged in a matrix, making up a memory cell array. Drains at ends of the NAND cells arranged along the columns of the memory cell array are connected in common to a bit line through respective selection gate transistors, and sources at opposite ends of the NAND cells are connected to a common source line through respective selection gate transistors. Control gates of the memory transistors and gate electrodes of the selection gate transistors are connected in common to a control gate line (word line) and a selecting gate line, respectively, along the rows of the memory cell array.

Data are written successively from memory transistors that are farther from the bit line. In the case of an n channel, a high potential (20 V or the like) is applied to the control gate of a selected memory transistor, and an intermediate potential (e.g., 10 V) is applied to the control gate of an unselected memory transistor positioned closer to the bit line than the selected memory transistor and the gate of a selection gate transistor. At this time, the potential of the bit line is transmitted via the selection gate transistor and the unselected memory transistor to the drain of the selected memory transistor.

For writing data "1", a high electric field is applied between the gate and drain of the selected memory transistor, and electrons are injected from the substrate into the floating gate, changing the threshold of the selected memory transistor in a positive direction. When data to be written is "0" or is not present, there are no threshold changes.

For erasing data, a high potential is applied to the p-type substrate, and a potential of 0 V is applied to the control gates of all the memory transistors and the gates of the selection gate transistors. In all the memory transistors, electrons of the floating gates are discharged into the substrate, changing the threshold in a negative direction.

For reading data, a selection gate transistor and an unselected memory transistor which is closer to the bit line than the selected memory transistor are turned on, and a potential of 0 V is applied to the gate of the selected memory transistor. At this time, data "0" or "1" is determined by reading a current flowing through the bit line.

In the conventional nonvolatile semiconductor memory devices, since a high potential is supplied to the bit line for writing data, the selected transistors need to comprise transistors having a high withstand voltage (large resistance). Therefore, when data are read, the current drive capability is lowered, and the speed at which to read the data is reduced. If enhanced transistors having a large current drive capability are used as the selected transistors for achieving a desired data reading speed, then it is necessary to lower the writing drain potential as no withstand voltage is available when writing data, resulting in a reduction in the data writing speed. These problems are caused because one selected transistor is used for both writing data and reading data.

SUMMARY OF THE INVENTION

It is therefore an object of the present invention to provide a nonvolatile semiconductor memory device which is capable of reading stored data at an increased speed without causing a delay in the speed for writing data.

According to the present invention, a nonvolatile semiconductor memory device has a group of signal line selecting transistors for selecting signal lines to write data in and read data from memory elements. The group of signal line selecting transistors include writing signal line selecting transistors and reading signal line selecting transistors.

For writing data, a high potential required to write the data is applied to selected bit lines by a writing circuit. Due to the high potential applied, the writing signal line selecting transistors comprise transistors having a large resistance with a thick gate oxide film. For reading data, a potential required to read the data is supplied from a sense amplifier. Because the supplied potential is low, the reading signal line selecting transistors comprise ordinary transistors.

Therefore, there are two types of signal line selecting transistors for writing data and reading data. Since the writing signal line selecting transistors are used to write data and the reading signal line selecting transistors are used to read data, the speed for reading data is prevented from being lowered and the speed for writing data is also prevented from being lowered.

As described above, the two types of signal line selecting transistors for writing data and reading data are employed. The reading signal line selecting transistors comprise enhanced transistors with a reduced resistance for an increased current drive capability. Therefore, the speed for reading data can be increased.

The above and other objects, features, and advantages of the present invention will become apparent from the following description referring to the accompanying drawings which illustrate an example of a preferred embodiment of the present invention.

DETAILED DESCRIPTION OF THE PREFERRED EMBODIMENT

Figure 1:
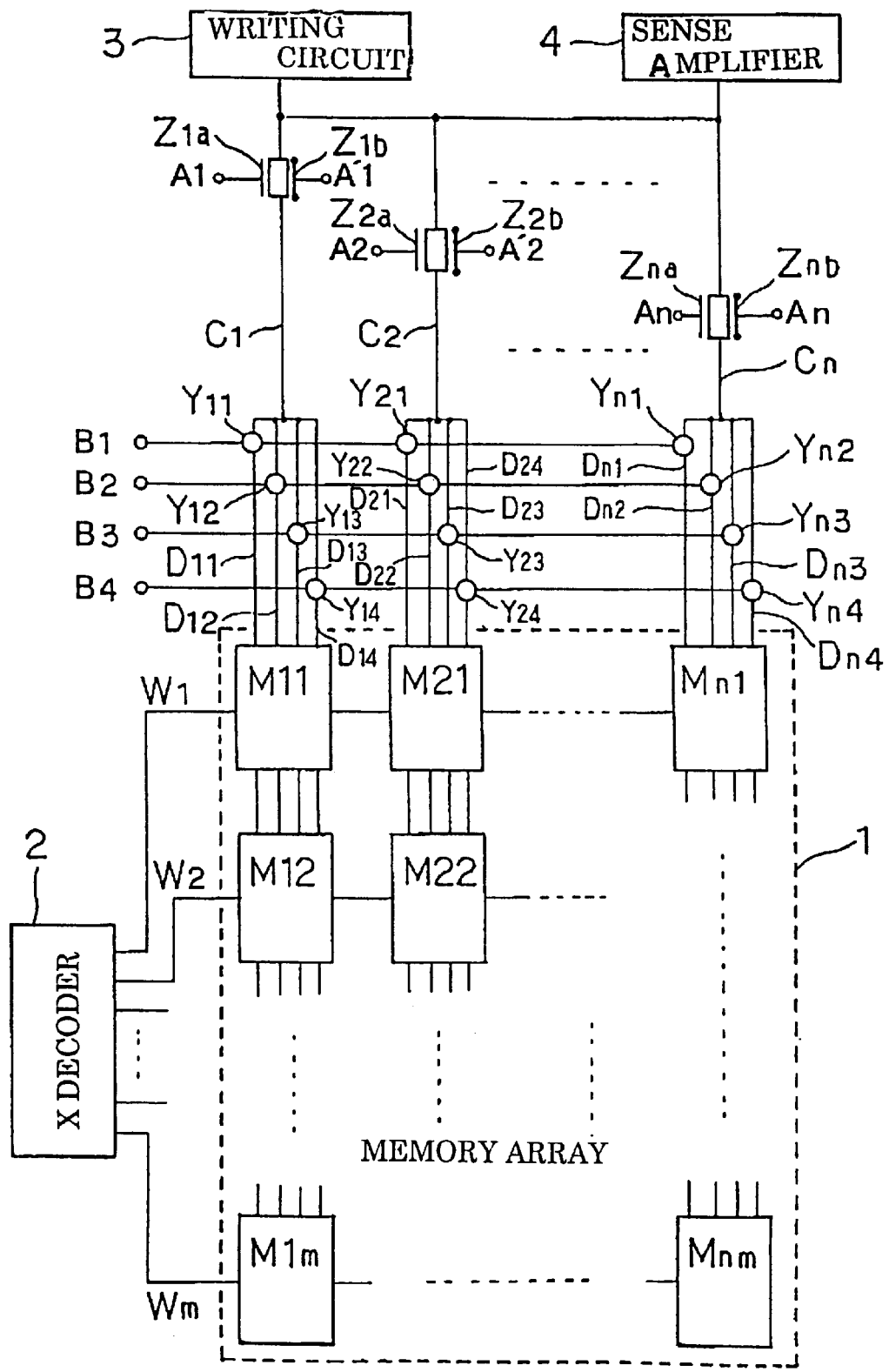
FIG. 1 is a block diagram of a nonvolatile semiconductor memory device according to an embodiment of the present invention.

FIG. 1 shows in block form a nonvolatile semiconductor memory device according to an embodiment of the present invention. According to the embodiment, the nonvolatile semiconductor memory device has signal selection transistors for writing and reading data and bit line selecting transistors.

While 4-bit memory elements will be described below for illustrative purposes, the nonvolatile semiconductor memory device may comprise 8-bit memory elements or 16-bit memory elements.

As shown in FIG. 1, the nonvolatile semiconductor memory device has a memory array 1 comprising a plurality of 4-bit memory elements (M11–Mnm), m word lines (W1–Wm) connected to the control gates of the memory elements, an X decoder 2 for selecting one of the m word lines, four bit lines (D11–D14 . . . Dn1–Dn4) connected to the drains of each of the 4-bit memory elements, signal line selecting transistors (Z1a, Z1b–Zna, Znb) for selecting one of n signal lines (C1–Cn) connected respectively to the bit lines, bit line selecting transistors (Y11–Y14 . . . Yn1–Yn4) for selecting one of the four bit lines connected to a signal line CI selected by the signal line selecting transistors, drive input terminals (B1–B4) connected to the bit line selecting transistors, a writing circuit 3 for supplying a writing potential to the bit lines via the signal lines for writing data, and a sense amplifier 4 for supplying a reading potential to the bit lines via the signal lines to determine data to be read based on whether there is a detected current or not.

The signal line selecting transistors Zib comprise transistors having a large resistance with a thick gate oxide film since a high potential is applied from the writing circuit 3 to the signal line selecting transistors Zib. The signal line selecting transistors Zia for reading data comprise transistors having a small resistance. These two types of parallel-connected signal line selecting transistors Zia, Zib should preferably be integrally combined with each other insofar as they can selectively be energized.

For writing data, a memory element Mij is selected by the X decoder 2, a signal line selecting transistor Zib, and a bit line selecting transistor (Yi1–Yi4), and a writing gate potential is applied to the control gate of the selected memory element Mij by a word line j, a writing drain potential is applied to the drain of the selected memory element Mij by a bit line, and a ground potential is applied to the source of the selected memory element Mij by a source line. At this time, since a high potential is applied to the signal line selecting transistor Zib by the writing circuit 3, the signal line selecting transistor Zib having a large resistance with a thick gate oxide film is used.

For reading data, a memory element Mij is selected by the X decoder 2, a signal line selecting transistor Zia, and a bit line selecting transistor (Yi1–Yi4), and a reading gate potential is applied to the control gate of the selected memory element Mij by a word line j, a reading drain potential is applied to the drain of the selected memory element Mij by a bit line, and a ground potential is applied to the source of the selected memory element Mij by a source line. At this time, the transistor Zia having a small resistance is used as the signal line selecting transistor.

In this embodiment, for writing data or reading data, one of the two types of parallel-connected signal line selecting transistors Zia, Zib is used.

Operation of the nonvolatile semiconductor memory device according to the embodiment of the present invention will be described below with reference to FIG. 1.

A process of writing data in and reading data from the memory element M11 shown in FIG. 1 will be described below.

For writing data, a writing word potential is applied to the word line W1 selected by the X decoder 2. A ground potential is applied to the source of the 4-bit memory element M11 by a source line. A potential generated by the writing circuit 3 is supplied by the signal line selecting transistor Z1b to the drains of the bit line selecting transistors (Y11–Y14), which apply a writing potential to the drain of the memory element M11. Which of the bit lines (D11–D14) of the memory element M11, where the data is to be written is to be selected, is determined by which of the drive input terminals (B1–B4) of the bit line selecting transistors (Y11–Y14) the signal is to be supplied to.

For reading data, a reading word potential is applied to the word line W1 selected by the X decoder 2. A ground potential is applied to the source of the memory element M11 by a source line. A potential required for reading data is applied from the sense amplifier 4 by the signal line selecting transistor Z1a to the drains of the bit line selecting transistors (Y11–Y14), which apply a reading potential to the drain of the memory element M11. Which of the bit lines (D11–D14) of the memory element M11 where the data is to be read is to be selected is determined by which of the drive input terminals (B1–B4) of the bit line selecting transistors (Y11–Y14) the signal is to be supplied to.

Table 1 given below shows the voltages applied to the terminal A of a reading signal line selecting transistor, the terminal A' of a writing signal line selecting transistor, and the terminal of a bit line selecting transistor Y when data is to be written in and read from the first bit of the memory element M11.

TABLE 1

| | Reading signal line selecting transistor (A) | | Writing signal line selecting transistor (A') | | Bit line selecting transistor (B) | |
|---|---|---|---|---|---|---|
| | Selected | Unselected | Selected | Unselected | Selected | Unselected |
| Read | VCC | 0 V | 0 V | 0 V | VCC | 0 V |
| Write | 0 V | 0 V | 12 V | 0 V | 7.5 V | 0 V |

With respect to unselected memory elements (other than M11) for writing data, as shown in Table 1, a potential of 0 V is applied to the gate of a writing signal line selecting transistor Zb, a potential of 0 V is applied to the gate of a reading signal line selecting transistor Za, and a potential of 0 V is applied to the gates of the bit line selecting transistors (Y12–Y14), applying a potential of 0 V to the drains (D12–D14) of the memory element to make these drains (D12–D14) open. A potential of 0 V is applied to other word lines than the word line W1 by the X decoder 2.

With respect to unselected memory elements for reading data, a potential of 0 V is applied to the gate of a reading signal line selecting transistor Za, a potential of 0 V is applied to the gate of a writing signal line selecting transistor Zb, and a potential of 0 V is applied to the gates of the bit line selecting transistors (Y12–Y14), making the drains (D12–D14) of the memory element open. A potential of 0 V is applied to other word lines than the word line W1 by the X decoder 2.

While the 4-bit memory elements have been described above, the principles of the present invention are also applicable to a nonvolatile semiconductor memory device which comprises 8-bit memory elements or 16-bit memory elements.

It is to be understood that variations and modifications of the nonvolatile semiconductor memory device disclosed herein will be evident to those skilled in the art. It is intended that all such modifications and variations be included within the scope of the appended claims.

What is claimed is:

1. A nonvolatile semiconductor memory device comprising:
    a plurality of memory elements for electrically writing data therein and erasing data therefrom;
    writing signal line selecting transistors for applying writing signals to said memory elements, respectively; and
    reading signal line selecting transistors, which are different from said writing signal line selecting transistors, for delivering reading signals from said memory elements, respectively.

2. A nonvolatile semiconductor memory device according to claim 1, wherein said writing signal line selecting transistors and said reading signal line selecting transistors are integrally combined with each other.

3. A nonvolatile semiconductor memory device according to claim 1, wherein said writing signal line selecting transistors have a thick gate oxide film and a large resistance.

4. A nonvolatile semiconductor memory device according to claim 1, wherein said reading signal line selecting transistors have a small resistance.

5. A nonvolatile semiconductor memory device comprising:
    a plurality of memory elements for electrically writing data therein and erasing data therefrom;
    writing signal line selecting transistors for applying writing signals to said memory elements, respectively;
    reading signal line selecting transistors, which are different from said writing signal line selecting transistors, for delivering reading signals from said memory elements, respectively; and
    bit line selecting transistors connected between said writing signal line selecting transistors or said reading signal line selecting transistors and said memory elements, for selecting bit lines of each of said memory elements.

6. A nonvolatile semiconductor memory device according to claim 5, wherein said writing signal line selecting transistors and said reading signal line selecting transistors are integrally combined with each other.

7. A nonvolatile semiconductor memory device according to claim 5, wherein said writing signal line selecting transistors have a thick gate oxide film and a large resistance.

8. A nonvolatile semiconductor memory device according to claim 5, wherein said reading signal line selecting transistors have a small resistance.

9. A nonvolatile semiconductor memory device according to claim 5, wherein a common signal is applied to said bit line selecting transistors with respect to bit lines selected thereby.

10. A nonvolatile semiconductor memory device according to claim 1, wherein said device comprises an electrically erasable programmable read only memory.

11. A nonvolatile semiconductor memory device according to claim 1, wherein said reading signal line selecting transistors have a resistance which is lower than a resistance of said writing signal line selecting transistors.

12. A nonvolatile semiconductor memory device according to claim 1, further comprising:
    signal lines for transmitting signals to said plurality of memory elements;
    a write circuit for supplying a writing potential to bit lines via said signal lines; and
    a sense amplifier for supplying a read potential to bit lines via said signal lines.

13. A nonvolatile semiconductor memory device according to claim 2, wherein said reading signal line selecting transistors and said writing signal line selecting transistors are selectively energized.

14. A nonvolatile semiconductor memory device according to claim 1, wherein said memory elements comprise one of 4-bit memory elements, 8-bit memory elements and 16-bit memory elements.

15. A nonvolatile semiconductor memory device according to claim 1, wherein said reading signal line selecting transistors comprise enhanced transistors with a high current drive capability.

16. A nonvolatile semiconductor memory device according to claim 5, wherein said device comprises an electrically erasable programmable read only memory.

17. A nonvolatile semiconductor memory device according to claim 5, wherein said reading signal line selecting transistors have a resistance which is lower than a resistance of said writing signal line selecting transistors.

18. A nonvolatile semiconductor memory device according to claim 5, further comprising:
    signal lines for transmitting signals to said plurality of memory elements;
    a write circuit for supplying a writing potential to bit lines via said signal lines; and
    a sense amplifier for supplying a read potential to bit lines via said signal lines.

19. A nonvolatile semiconductor memory device according to claim 6, wherein said reading signal line selecting transistors and said writing signal line selecting transistors are selectively energized.

20. A nonvolatile semiconductor memory device according to claim 5, wherein said memory elements comprise one of 4-bit memory elements, 8-bit memory elements and 16-bit memory elements.

* * * * *